United States Patent
Park

(10) Patent No.: US 11,662,780 B2
(45) Date of Patent: May 30, 2023

(54) FOLDABLE DISPLAY DEVICE WITH SUPPORT

(71) Applicant: Samsung Display Co., LTD., Yongin-si (KR)

(72) Inventor: Chang Min Park, Gwangmyeong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 17 days.

(21) Appl. No.: 17/159,860

(22) Filed: Jan. 27, 2021

(65) Prior Publication Data
US 2021/0233447 A1    Jul. 29, 2021

(30) Foreign Application Priority Data
Jan. 28, 2020  (KR) .................. 10-2020-0009929

(51) Int. Cl.
G06F 1/16    (2006.01)
H05K 5/02    (2006.01)
H05K 5/03    (2006.01)

(52) U.S. Cl.
CPC .......... G06F 1/1681 (2013.01); G06F 1/1652 (2013.01); *H05K 5/0226* (2013.01); *H05K 5/03* (2013.01)

(58) Field of Classification Search
CPC .... G06F 1/1681; G06F 1/1652; H05K 5/0226
See application file for complete search history.

(56) References Cited

U.S. PATENT DOCUMENTS

| | | | |
|---|---|---|---|
| 9,490,312 B2 * | 11/2016 | Lee ............... | H01L 27/3276 |
| 9,983,424 B2 | 5/2018 | Kim et al. | |
| 9,985,086 B2 * | 5/2018 | Kwon ............. | H01L 27/3258 |
| 10,074,824 B2 * | 9/2018 | Han ............... | G06F 1/1652 |
| 10,194,543 B2 * | 1/2019 | Seo ................ | G06F 1/1626 |
| 10,411,084 B2 * | 9/2019 | Yeo ............... | H01L 51/0097 |
| 10,439,017 B2 * | 10/2019 | Kim ............... | H01L 27/1218 |
| 10,490,771 B2 * | 11/2019 | Kim ............... | H01L 51/5253 |
| 10,539,978 B2 * | 1/2020 | Lee ................ | G06F 1/1681 |
| 10,620,668 B2 * | 4/2020 | Park ............... | G06F 1/1681 |

(Continued)

FOREIGN PATENT DOCUMENTS

| | | |
|---|---|---|
| KR | 2016-0144912 | 12/2016 |
| KR | 2017-0077927 | 7/2017 |

(Continued)

*Primary Examiner* — Rockshana D Chowdhury
*Assistant Examiner* — Douglas R Burtner
(74) *Attorney, Agent, or Firm* — H.C. Park & Associates, PLC

(57) ABSTRACT

A foldable display device, includes: a flexible display module including a first non-bendable portion, a second non-bendable portion spaced from the first non-bendable portion in a first direction, and a bendable portion disposed between the first non-bendable portion and the second non-bendable portion; and a support disposed on the flexible display module, the support including a patterned portion having a first pattern and a second pattern alternatively disposed along a second direction intersecting the first direction, wherein the first pattern includes a first discontinuity having a first shape, and the second pattern includes a second discontinuity having a second shape different from the first shape.

13 Claims, 11 Drawing Sheets

(56) References Cited

U.S. PATENT DOCUMENTS

| | | | |
|---|---|---|---|
| 10,831,234 B1* | 11/2020 | Watamura | G06F 1/1652 |
| 10,856,420 B2* | 12/2020 | Kim | H05K 1/18 |
| 10,873,043 B2* | 12/2020 | Jin | H01L 51/0097 |
| 10,930,883 B2* | 2/2021 | Park | H01L 51/0097 |
| 10,936,012 B2* | 3/2021 | Kim | H01L 51/0097 |
| 11,112,548 B2* | 9/2021 | Cho | B32B 3/12 |
| 11,152,580 B2* | 10/2021 | Kawaguchi | G02F 1/1335 |
| 11,221,648 B2* | 1/2022 | Myeong | G06F 1/1616 |
| 11,243,564 B2* | 2/2022 | Kim | G06F 1/1616 |
| 11,258,035 B2* | 2/2022 | Kim | H05K 5/0086 |
| 2017/0188471 A1* | 6/2017 | Fan | G06F 1/1601 |
| 2018/0103552 A1* | 4/2018 | Seo | G06F 1/1652 |
| 2019/0165311 A1* | 5/2019 | Lee | H01L 51/0097 |
| 2019/0334114 A1* | 10/2019 | Park | G06F 1/1652 |
| 2020/0146165 A1* | 5/2020 | Zuo | H05K 5/0017 |
| 2020/0333846 A1* | 10/2020 | Jan | G06F 1/1652 |
| 2021/0029841 A1* | 1/2021 | Kim | G06F 1/1616 |
| 2021/0068272 A1* | 3/2021 | Horiuchi | G06F 1/1616 |
| 2021/0141124 A1* | 5/2021 | Park | H05K 5/0226 |
| 2021/0192984 A1* | 6/2021 | Yoo | G09F 9/301 |
| 2021/0286407 A1* | 9/2021 | Kim | H04M 1/0216 |
| 2022/0103670 A1* | 3/2022 | Liao | G06F 1/1681 |
| 2022/0155823 A1* | 5/2022 | Shin | G06F 1/1652 |

FOREIGN PATENT DOCUMENTS

| | | |
|---|---|---|
| KR | 2019-0049454 | 5/2019 |
| KR | 2019-0064183 | 6/2019 |

* cited by examiner

FOLDABLE DISPLAY DEVICE WITH SUPPORT

CROSS-REFERENCE TO RELATED APPLICATION

This application claims priority from and the benefit of Korean Patent Application No. 10-2020-0009929, filed on Jan. 28, 2020, which is hereby incorporated by reference for all purposes as if fully set forth herein.

BACKGROUND

Field

Exemplary embodiments of the invention relate generally to a display device, and more particularly, to a foldable display device.

Discussion of the Background

A display device may provide information to a user by displaying an image. Recently, a flexible display device deformable in various forms has been developed. Unlike a flat panel display, the flexible display device may be folded, bent, or rolled like a paper. The flexible display device can be portable and more convenient for the user.

The above information disclosed in this Background section is only for understanding of the background of the inventive concepts, and, therefore, it may contain information that does not constitute prior art.

SUMMARY

Foldable display devices constructed according to the principles and exemplary implementations of the invention are capable of preventing deformation due to stress. Particularly, deformation of the support plate may be reduced or prevented when tensile stress is applied to the patterned portion of the support plate.

For example, according to some exemplary implementations, the patterned portion of the support plate may include first and second patterns alternatively disposed along one direction, which have different shaped holes, and Poisson's ratios of opposite polarities.

Additional features of the inventive concepts will be set forth in the description which follows, and in part will be apparent from the description, or may be learned by practice of the inventive concepts.

According to one aspect of the invention, a foldable display device, includes: a flexible display module including a first non-bendable portion, a second non-bendable portion spaced from the first non-bendable portion in a first direction, and a bendable portion disposed between the first non-bendable portion and the second non-bendable portion; and a support disposed on the flexible display module, the support including a patterned portion having a first pattern and a second pattern alternatively disposed along a second direction intersecting the first direction, wherein the first pattern includes a first discontinuity having a first shape, and the second pattern includes a second discontinuity having a second shape different from the first shape.

The second discontinuity may include a hole having a generally ribbon-like shape.

The dimension in the second direction of the first discontinuity may decrease and a dimension in the second direction of the second discontinuity may increase when applying a tensile stress to the patterned portion in the first direction.

The first discontinuity may include a first hole having a generally convex hexagonal shape and the second discontinuity may include a second hole having a generally rectangular shape when applying a tensile stress to the patterned portion in the first direction.

The first hole may have a generally honeycomb-like shape when applying the tensile stress to the patterned portion in the first direction.

The second discontinuity may be spaced from the first discontinuity in the second direction.

The dimension of the second discontinuity in the second direction may be substantially equal to a dimension of the first discontinuity in the second direction.

The patterned portion may further include a third discontinuity disposed between the first pattern and the second pattern.

The third discontinuity may include a third hole having a generally concave hexagonal shape including a width in the second direction that may be substantially constant when applying a tensile stress to the patterned portion in the first direction.

The third discontinuity may include a third hole having a generally convex hexagonal shape when applying a tensile stress to the patterned portion in the first direction.

The second discontinuity may be spaced from the first discontinuity in the second direction, and the third discontinuity may be spaced from the first discontinuity and the second discontinuity in the first direction.

The third discontinuity may include a third hole having a first portion overlapping the first pattern and a second portion overlapping the second pattern, wherein the first portion may have a generally rectangular shape, and the second portion may have a generally trapezoidal shape.

The first portion may have a generally trapezoidal shape and the second portion may have a generally rectangular shape when applying a tensile stress to the patterned portion in the first direction.

The support may include a support plate including at least one of stainless steel, copper (Cu), and graphite.

The first and second discontinuities may include a material having different properties than the support.

The first and second discontinuities may include first and second holes, and the material may include a filling member disposed in the first and second holes, the filling member having an elastic modulus greater than an elastic modulus of the support.

The material may include a polymer resin.

The first pattern may have a positive Poisson's ratio, and the second pattern may have a negative Poisson's ratio.

According to another aspect of the invention, a foldable display device, includes: a flexible display module including a first non-bendable portion, a second non-bendable portion spaced from the first non-bendable portion in a first direction, and a bendable portion disposed between the first non-bendable portion and the second non-bendable portion; and a support on the flexible display module, the support including a first portion and a second portion alternatively disposed along a second direction intersecting the first direction, wherein the first portion has a positive Poisson's ratio, and the second portion has a negative Poisson's ratio.

The first portion may be contracted in the second direction and the second portion expanded in the second direction when applying a tensile stress to the support in the first direction.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
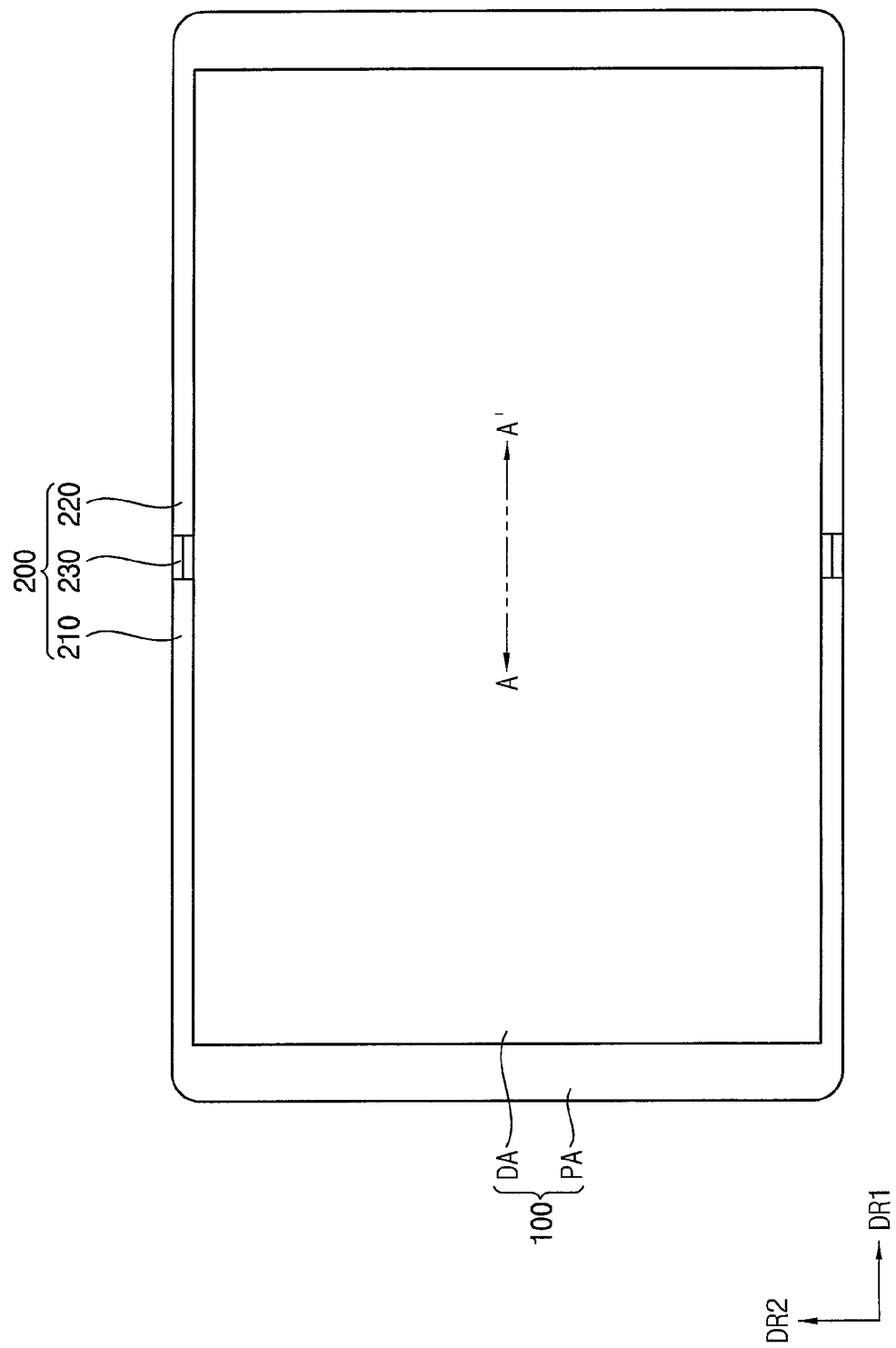
FIG. 1 is a plan view of an exemplary embodiment illustrating an unfolded position of a foldable display device constructed according to principles of the invention.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Figure 2:
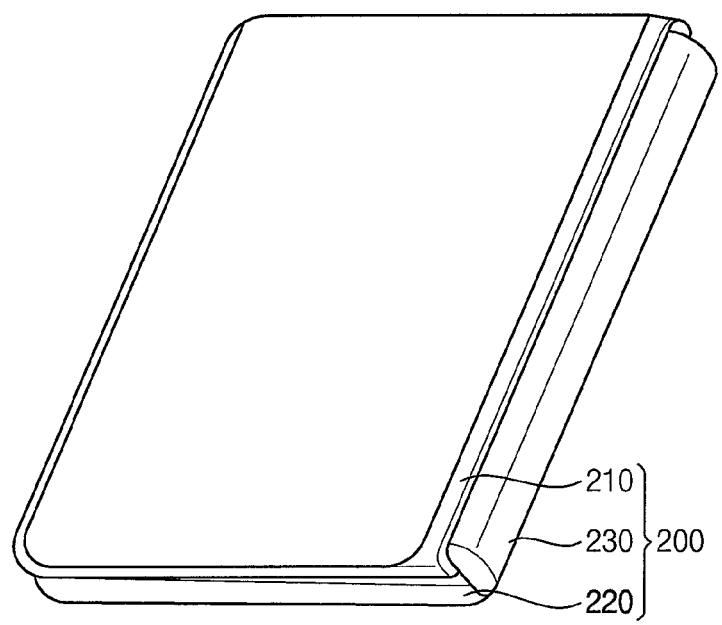
FIG. 2 is a perspective view illustrating a folded position of the foldable display device of FIG. 1.

FIG. 1 is a plan view of an exemplary embodiment illustrating an unfolded position of a foldable display device constructed according to principles of the invention. FIG. 2 is a perspective view illustrating a folded position of the foldable display device of FIG. 1.

Referring to FIGS. 1 and 2, a foldable display device according to an embodiment may include a flexible display module 100 and a case 200. The flexible display module 100 may include a display area DA and a peripheral area PA. The display area DA may display an image, and the peripheral area PA may surround the display area DA to form a bezel of the foldable display device.

The flexible display module 100 may include a flexible substrate including flexible plastic or the like, instead of a rigid substrate including rigid glass or the like. Accordingly, the flexible display module 100 may be folded or unfolded freely within a predetermined range. The flexible display module 100 may be supported by the case 200. for folding or unfolding. The case 200 may include a first cover 210, a second cover 220, and a hinge portion 230. The first cover 210 and the second cover 220 may be rotatably coupled to the hinge portion 230. The hinge portion 230 may be positioned between the first cover 210 and the second cover 220.

Figure 3:
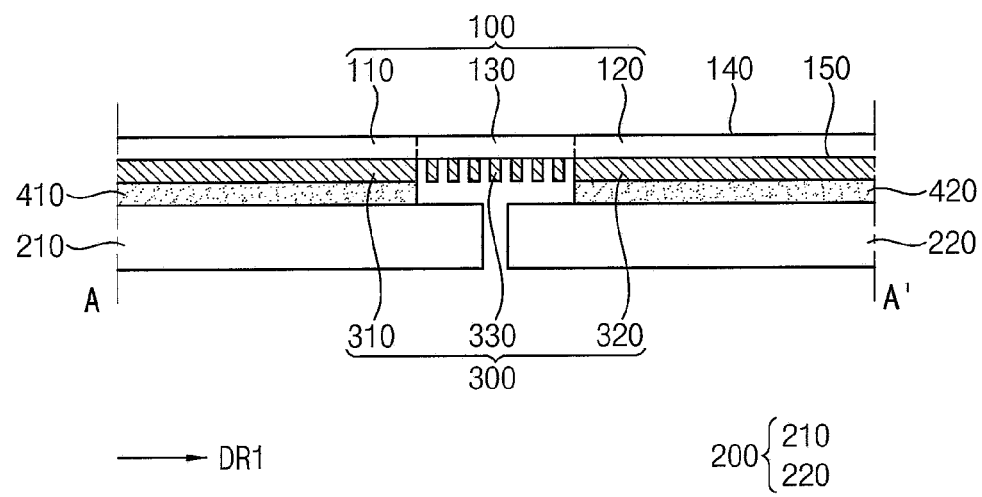
FIG. 3 is a cross-sectional view taken along line A-A' of FIG. 1 illustrating one exemplary embodiment of the foldable display device.

FIG. 3 is a cross-sectional view taken along line A-A' of FIG. 1 illustrating one exemplary embodiment of the foldable display device.

Referring to FIG. 3, the foldable display device may include a flexible display module 100, a case 200, and a support, which may be in the form of a support plate 300. The flexible display module 100 may include a first non-bendable portion 110, a second non-bendable portion 120, and a bendable portion 130. The second non-bendable portion 120 may be positioned in the first direction DR1 from the first non-bendable portion 110, and the bendable portion 130 may be positioned between the first non-bendable portion 110 and the second non-bendable portion 120. The first non-bendable portion 110 and the second non-bendable portion 120 may be portions that are not folded in the flexible display module 100. The bendable portion 130 may be a portion that is folded in the flexible display module 100.

The flexible display module 100 may include a display surface 140 and a back surface 150 opposite to the display surface 140. The flexible display module 100 may display an image toward the display surface 140. The back surface 150 may be a non-display surface on which the image is not displayed. The case 200 including the first cover 210 and the second cover 220 may be disposed on the back surface 150 of the flexible display module 100.

The first cover 210 may be disposed on the first non-bendable portion 110 of the flexible display module 100. The first cover 210 may be disposed on the back surface 150 of the first non-bendable portion 110 and the back surface 150 of the bendable portion 130 adjacent to the first non-bendable portion 110 to protect the back surface 150 of the first non-bendable portion 110 and the back surface 150 of the bendable portion 130 adjacent to the first non-bendable portion 110.

The second cover 220 may be disposed on the second non-bendable portion 120 of the flexible display module 100. The second cover 220 may be disposed on the back surface 150 of the second non-bendable portion 120 and the back surface 150 of the bendable portion 130 adjacent to the second non-bendable portion 120 to protect the back surface 150 of the second non-bendable portion 120 and the back surface 150 of the bendable portion 130 adjacent to the second non-bendable portion 120.

The support plate 300 may be disposed between the flexible display module 100 and the case 200. The support plate 300 may support the flexible display module 100, may release or disperse heat generated from the flexible display module 100, and may prevent impurities from being conducted into the flexible display module 100 from outside.

The support plate 300 may include a first non-patterned portion 310, a second non-patterned portion 320, and a patterned portion 330. The second non-patterned portion 320 may be disposed in the first direction DR1 from the first non-patterned portion 310, and the patterned portion 330 may be disposed between the first non-patterned portion 310 and the second non-patterned portion 320. The first non-patterned portion 310 and the second non-patterned portion 320 may overlap the first non-bendable portion 110 and the second non-bendable portion 120 of the flexible display module 100, respectively, in the thickness direction normal to DR1. The patterned portion 330 may overlap the bendable portion 130 of the flexible display module 100 in the thickness direction normal.

The first non-patterned portion 310 may be disposed between the first non-bendable portion 110 of the flexible display module 100 and the first cover 210. The first non-patterned portion 310 may support the first non-bendable portion 110 of the flexible display module 100. For example, an adhesive layer may be interposed between the first non-patterned portion 310 and the back surface 150 of the first non-bendable portion 110. The first non-patterned portion 310 may fixedly support and be attached to the first non-bendable portion 110.

The second non-patterned portion 320 may be disposed between the second non-bendable portion 120 of the flexible display module 100 and the second cover 220. The second non-patterned portion 320 may support the second non-bendable portion 120 of the flexible display module 100. For example, an adhesive layer may be interposed between the second non-patterned portion 320 and the back surface 150 of the second non-bendable portion 120. The second non-patterned portion 320 may fixedly support and be attached to the first non-bendable portion 120.

A first adhesive layer 410 may be disposed between the first cover 210 and the first non-patterned portion 310, and a second adhesive layer 420 may be disposed between the second cover 220 and the second non-patterned portion 320. The first adhesive layer 410 may connect the first cover 210 and the first non-patterned portion 310, and the second adhesive layer 420 may connect the second cover 220 and the second non-patterned portion 320.

The patterned portion 330 may include a first portion in the form of a first pattern and a second portion in the form of a second pattern alternatively disposed along one direction and including holes having different shapes from each other. Elements of the patterned portion 330 will be described in detail with reference to FIGS. 5 and 6 below.

The support plate 300 may include at least one of stainless steel (SUS), copper (Cu), and graphite. The durability of the support plate 300 may be improved when the support plate 300 includes stainless steel. Further, heat dissipation characteristics of the support plate 300 may be improved when the support plate 300 includes copper or graphite.

Figure 4:
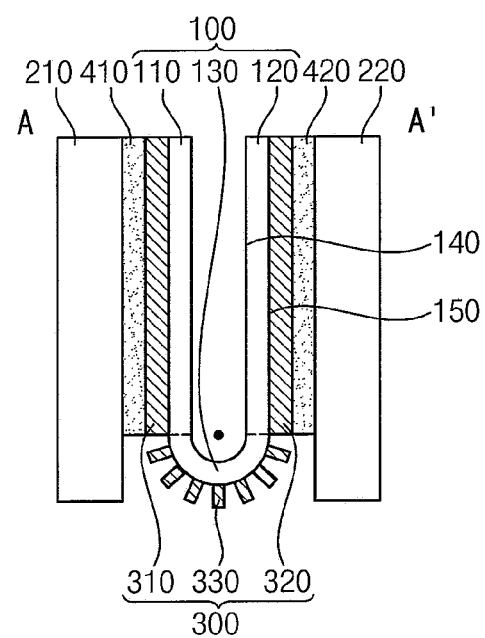
FIG. 4 is a cross-sectional view illustrating a folded position of the foldable display device of FIG. 3.

FIG. 4 is a cross-sectional view illustrating a folded position of the foldable display device of FIG. 3.

Referring to FIGS. 3 and 4, when the foldable display device is unfolded, the flexible display module 100 may be unfolded such that portions of the display surface 140 are arranged substantially horizontally on the same plane. For example, when an external force is applied to the folded foldable display device in an outward direction, the first cover 210 and the second cover 220 may be rotated in a counterclockwise direction and in a clockwise direction about the hinge portion 230 as depicted in FIG. 2, respectively, so that the flexible display module 100 may be unfolded. When the flexible display module 100 is unfolded, the display surface 140 of the first non-bendable portion 110 and the display surface 140 of the second non-bendable portion 120 may be substantially parallel to each other.

When the foldable display device is folded, the flexible display module 100 may be folded such that the portions of the display surface 140 face each other. For example, when the external force is applied to the unfolded foldable display device in an inward direction, the first cover 210 and the second cover 220 may be rotated in a clockwise direction and in a counterclockwise direction about the hinge portion 230 in FIG. 2, respectively, so that the flexible display module 100 may be folded. When the flexible display module 100 is folded, the display surface 140 of the first non-bendable portion 110 and the display surface 140 of the second non-bendable portion 120 may face each other.

Figure 5:
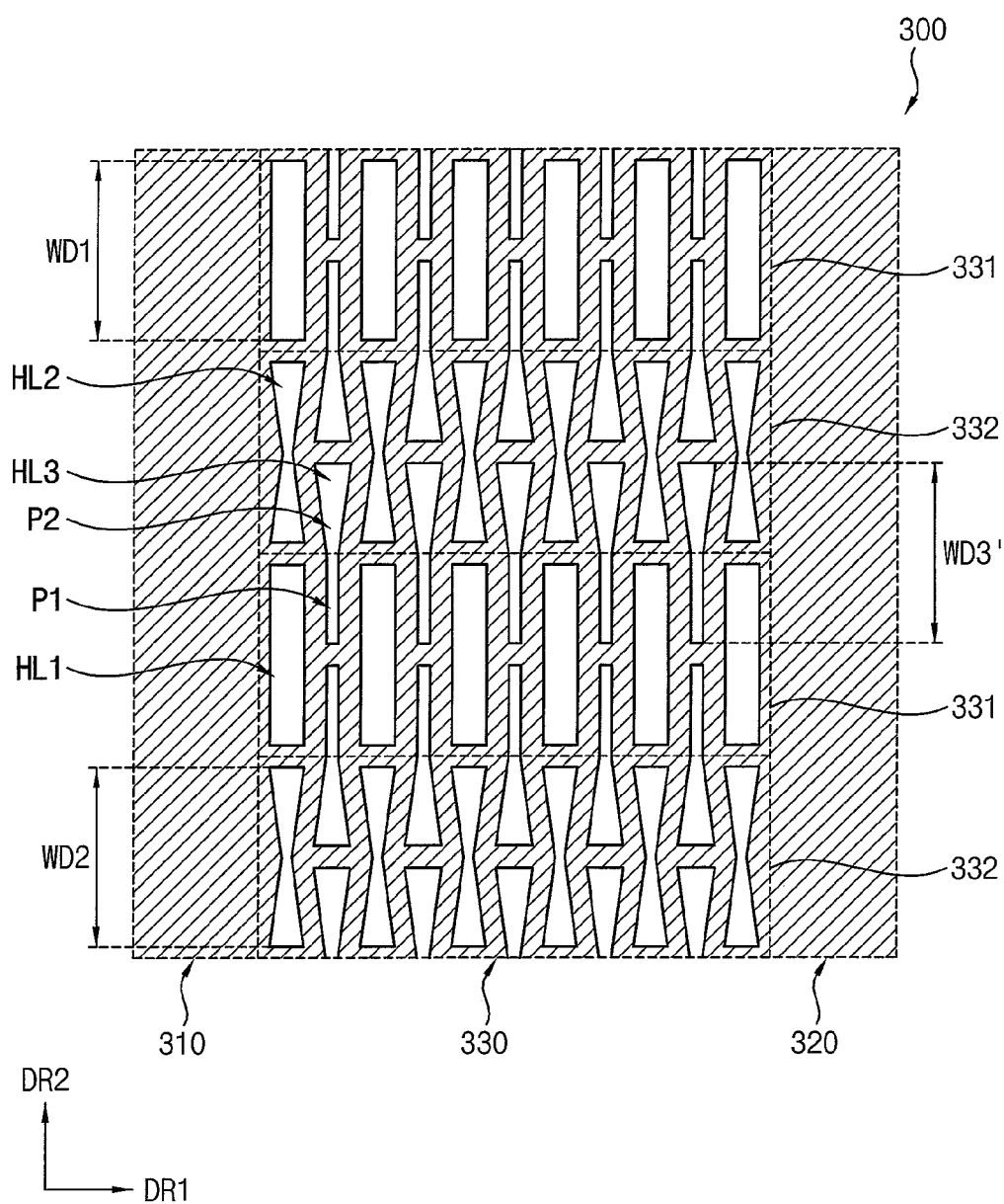
FIG. 5 is a plan view illustrating an exemplary embodiment of a support plate constructed according to principles of the invention.

FIG. 5 is a plan view illustrating an exemplary embodiment of a support plate constructed according to principles of the invention.

Referring to FIG. 5, the support plate 300 may include the first non-patterned portion 310, the second non-patterned portion 320, and the patterned portion 330. Patterns may not be formed in the first non-patterned portion 310 and the second non-patterned portion 320.

The patterned portion 330 may include a first pattern 331 and a second pattern 332. The first pattern 331 and the second pattern 332 may be alternatively disposed along a second direction DR2 intersecting the first direction DR1. In other words, the patterned portion 330 may include first patterns 331 and second patterns 332 alternatively disposed along the second direction DR2.

The first pattern 331 may include first discontinuities in the form of first holes HL1 disposed along the first direction DR1, and the second pattern 332 may include second discontinuities in the form of second holes HL2 disposed along the first direction DR1. Further, the patterned portion 330 may include third discontinuities in the form of third holes HL3 disposed between the first pattern 331 and the second pattern 332. The third holes HL3 may be disposed along the first direction DR1. A portion of the third hole HL3 may overlap the first pattern 331, and another portion of the third hole HL3 may overlap the second pattern 332. In an exemplary embodiment, the third hole HL3 may include a first portion P1 overlapping the first pattern 331 and a second portion P2 overlapping the second pattern 332.

The second hole HL2 may be disposed in the second direction DR2 from the first hole HL1. The third hole HL3 may be disposed in the first direction DR1 from the first hole HL1 and the second hole HL2. For example, the first portion P1 of the third hole HL3 may be disposed in the first direction DR1 from the first hole HL1, and the second portion P2 of the third hole HL3 may be disposed in the first direction DR1 from the second hole HL2.

The first hole HL1 may have a first shape in the form of a generally rectangular shape. For example, the first hole HL1 may have a generally rectangular shape in which a pair of sides opposite to each other extend in the first direction DR1 and a pair of other sides opposite to each other extend in the second direction DR2.

The second hole HL2 may have a second shape in the form of a generally concave hexagonal shape different from the first shape. Here, the generally concave hexagon means a hexagon in which at least one internal angle is greater than about 180 degrees, and the concave hexagon has at least one vertex pointing inside. In an exemplary embodiment, the second hole HL2 may have a substantially symmetrically concave hexagonal shape in the second direction DR2. For example, the second hole HL2 may have a generally ribbon-like shape. In such an exemplary embodiment, the second hole HL2 may have the generally concave hexagonal shape in which a pair of sides opposite to each other extend in the first direction DR1 and a pair of vertexes opposite to each other point inside.

The third hole HL3 may have a generally concave hexagonal shape. In an exemplary embodiment, the third hole HL3 may have an asymmetrically generally concave hexagonal shape in the second direction DR2. For example, the first portion P1 of the third hole HL3 may have a generally rectangular shape, and the second portion P2 of the third hole HL3 may have a generally trapezoidal shape.

In an exemplary embodiment, a width WD2 in the second direction DR2 of the second hole HL2 may be substantially equal to a width WD1 in the second direction DR2 of the first hole HL1. However, the exemplary embodiments are not limited thereto, and in another exemplary embodiment, the width WD2 in the second direction DR2 of the second hole HL2 may be different from the width WD1 in the second direction DR2 of the first hole HL1.

Figure 6:
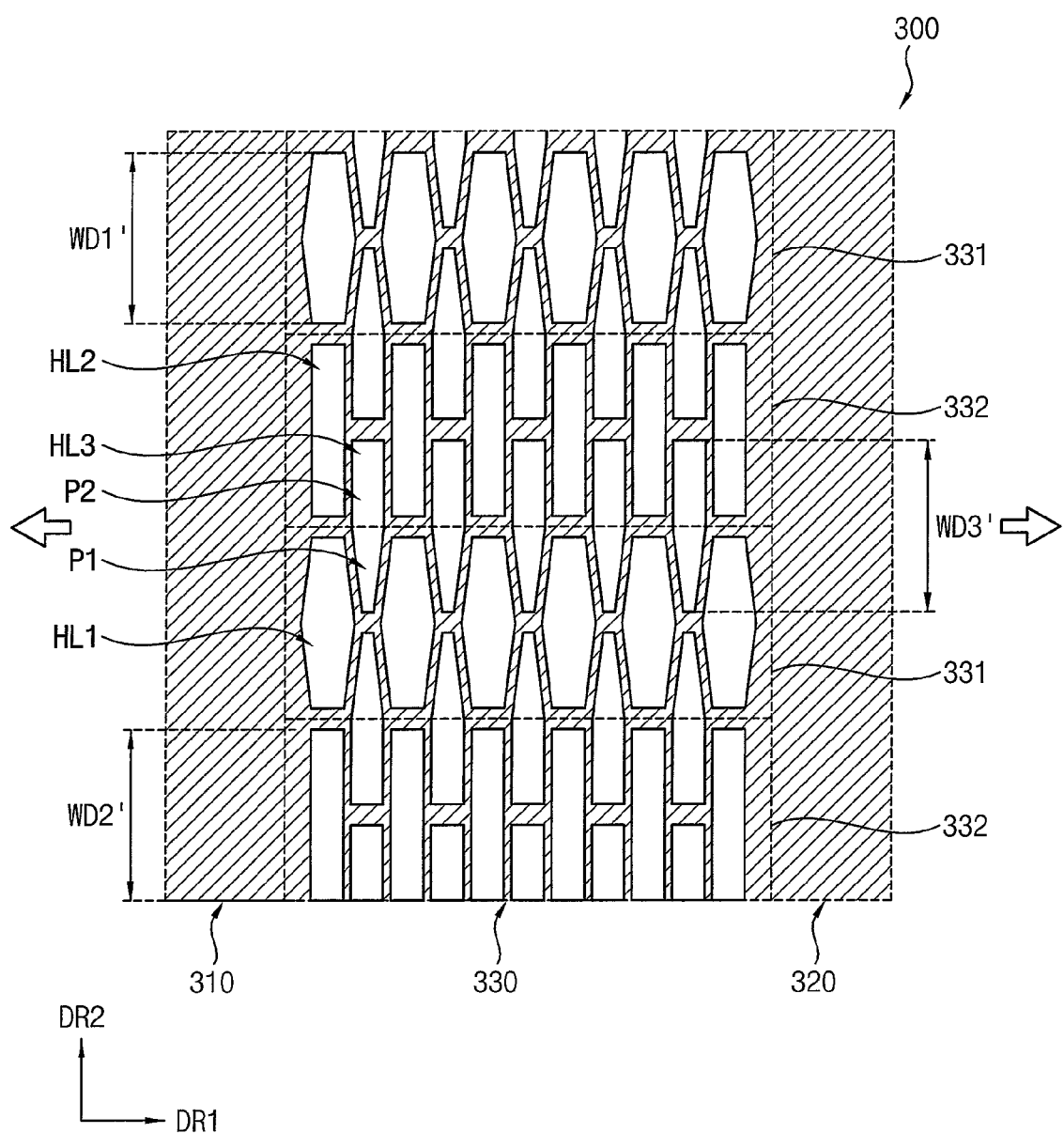
FIG. 6 is a plan view of an exemplary embodiment illustrating when tensile stress is applied to a patterned portion of the support plate of FIG. 5.

FIG. 6 is a plan view of an exemplary embodiment illustrating when tensile stress is applied to a patterned portion of the support plate of FIG. 5.

Referring to FIGS. 5 and 6, tensile stress may be applied to the bendable portion 130 of the flexible display module 100 when the foldable display device is folded as illustrated in FIG. 4. Therefore, the tensile stress may be applied to the patterned portion 330 of the support plate 300 overlapping the bendable portion 130 in the first direction DR1. When the tensile stress is applied to the patterned portion 330 in the first direction DR1, the width of each of the holes HL1, HL2, and HL3 of the patterned portion 330 may increase or decrease, and/or the shape of each of the holes HL1, HL2, and HL3 of the patterned portion 330 may be changed.

The first hole HL1 may have a generally convex hexagonal shape when tensile stress is applied to the patterned portion 330 in the first direction DR1. In other words, the shape of the first hole HL1 may be changed from the generally rectangular shape to the generally convex hexagonal shape when the tensile stress is applied to the patterned portion 330 in the first direction DR1. Here, the generally convex hexagon means a hexagon in which all internal angles are less than about 180 degrees, and all vertexes of the convex hexagon point outside. In an exemplary embodiment, the first hole HL1 may have a substantially symmetrically convex hexagonal shape in the second direction DR2 when the tensile stress is applied to the patterned portion 330 in the first direction DR1. For example, the first hole HL1 may have a generally honeycomb-like shape.

The second hole HL2 may have a generally rectangular shape when tensile stress is applied to the patterned portion 330 in the first direction DR1. In other words, the shape of the second hole HL2 may be changed from a generally concave hexagonal shape to the generally rectangular shape when the tensile stress is applied to the patterned portion 330 in the first direction DR1. For example, the second hole HL2 may have the generally rectangular shape in which a pair of sides opposite to each other extend in the first direction DR1 and a pair of other sides opposite to each other extend in the second direction DR2 when the tensile stress is applied to the patterned portion 330 in the first direction DR1.

The third hole HL3 may have a generally convex hexagonal shape when tensile stress is applied to the patterned portion 330 in the first direction DR1. In other words, the shape of the third hole HL3 may be changed from the generally concave hexagonal shape to the generally convex hexagonal shape when the tensile stress is applied to the patterned portion 330 in the first direction DR1. In an exemplary embodiment, the third hole HL3 may have an asymmetrically generally convex hexagonal shape in the second direction DR2 when the tensile stress is applied to the patterned portion 330 in the first direction DR1. For example, the first portion P1 of the third hole HL3 may have a generally trapezoidal shape, and the second portion P2 of the third hole HL3 may have the generally rectangular shape.

When the tensile stress is applied to the patterned portion 330, the width of the first hole HL1 in the second direction DR2 may decrease, and the width of the second hole HL2 may increase in the second direction DR2. In other words, the width WD1' in the second direction DR2 of the first hole HL1 after the tensile stress is applied to the patterned portion 330 in the first direction DR1 may be less than the width WD1 in the second direction DR2 of the first hole HL1 before the tensile stress is applied to the patterned portion 330 in the first direction DR1, and the width WD2' in the second direction DR2 of the second hole HL2 after the tensile stress is applied to the patterned portion 330 in the first direction DR1 may be less than the width WD2 in the second direction DR2 of the second hole HL2 before the tensile stress is applied to the patterned portion 330 in the first direction DR1. The shape of the first hole HL1 may be changed from the generally rectangular shape to the generally convex hexagonal shape when the tensile stress is applied to the patterned portion 330 in the first direction DR1, therefore, the dimension in the form of the width in the second direction DR2 of the first hole HL1 may decrease. Further, the shape of the second hole HL2 may be changed from the generally concave hexagonal shape to the generally rectangular shape when the tensile stress is applied to the patterned portion 330 in the first direction DR1. Therefore, the dimension in the form of the width in the second direction DR2 of the second hole HL2 may increase.

The first pattern 331 including the first hole HL1 may have a positive Poisson's ratio, and the second pattern 332 including the second hole HL2 may have a negative Poisson's ratio. The Poisson's ratio represents a ratio of the amount of deformation of an object in a substantially vertical direction of a tensile direction to the amount of deformation of the object in the tensile direction when tensile stress is applied to the object. The Poisson's ratio may be calculated by Equation 1 below.

$$v = -\frac{d\varepsilon_y}{d\varepsilon_x} \qquad \text{Equation 1}$$

In Equation 1, v means Poisson's ratio, $d\varepsilon_x$ means the amount of deformation of the object in the tensile direction, and $d\varepsilon_y$ means the amount of deformation of the object in the vertical direction of the tensile direction. When the tensile stress is applied to the patterned portion 330 in the first direction DR1, the width in the second direction DR2 of the first hole HL1 may decrease, and the width in the second direction DR2 of the second hole HL2 may increase. Accordingly, the first pattern 331 including the first hole HL1 may have a positive Poisson's ratio, and the second pattern 332 including the second hole HL2 may have a negative Poisson's ratio. In other words, when the tensile stress is applied to the patterned portion 330 in the first direction DR1, the first pattern 331 may be contracted in the second direction DR2, and the second pattern 332 may be expanded in the second direction DR2.

The width in the second direction DR2 of the third hole HL3 may be substantially constant when the tensile stress is applied to the patterned portion 330 in the first direction DR1. In other words, the width WD3' in the second direction DR2 of the third hole HL3 after the tensile stress is applied to the patterned portion 330 in the first direction DR1 may be substantially equal to the width WD3 in the second direction DR2 of the third hole HL3 before the tensile stress is applied to the patterned portion 330 in the first direction DR1. The shape of the third hole HL3 may be changed from the generally concave hexagonal shape to the generally convex hexagonal shape when the tensile stress is applied to the patterned portion 330 in the first direction DR1, therefore, the width in the second direction DR2 of the third hole HL3 may be substantially constant. Specifically, when the tensile stress is applied to the patterned portion 330 in the first direction DR1, the shape of the first portion P1 of the third hole HL3 may be changed from the generally rectangular shape to the generally trapezoidal shape so that the width in the second direction DR2 of the first portion P1 of the third hole HL3 may decrease, however, the shape of the second portion P2 of the third hole HL3 may be changed from the generally trapezoidal shape to the generally rectangular shape so that the width in the second direction DR2 of the second portion P2 of the third hole HL3 may increase.

Figure 7:
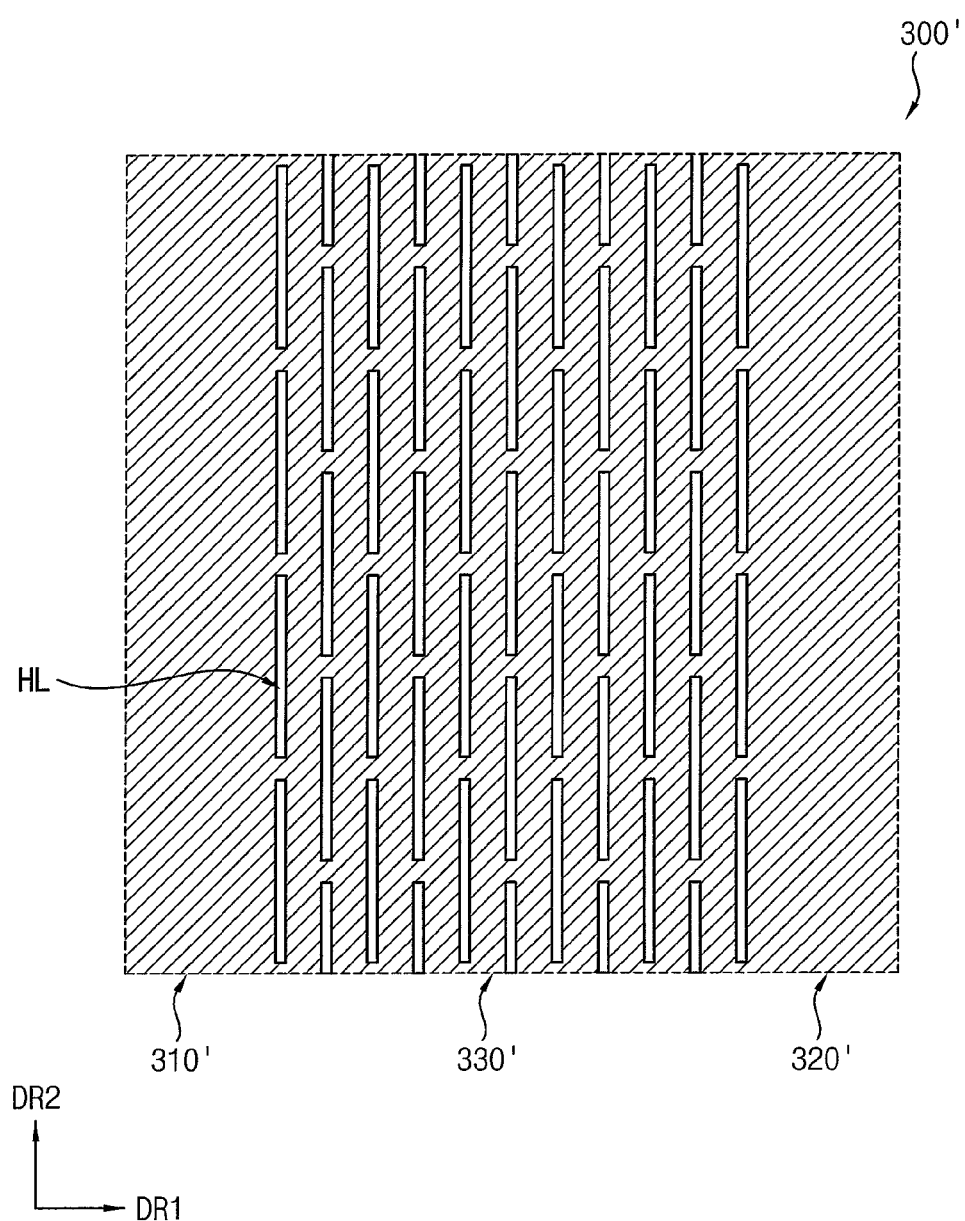
FIG. 7 is a plan view illustrating an embodiment of a support plate according to a comparative example.
Figure 8:
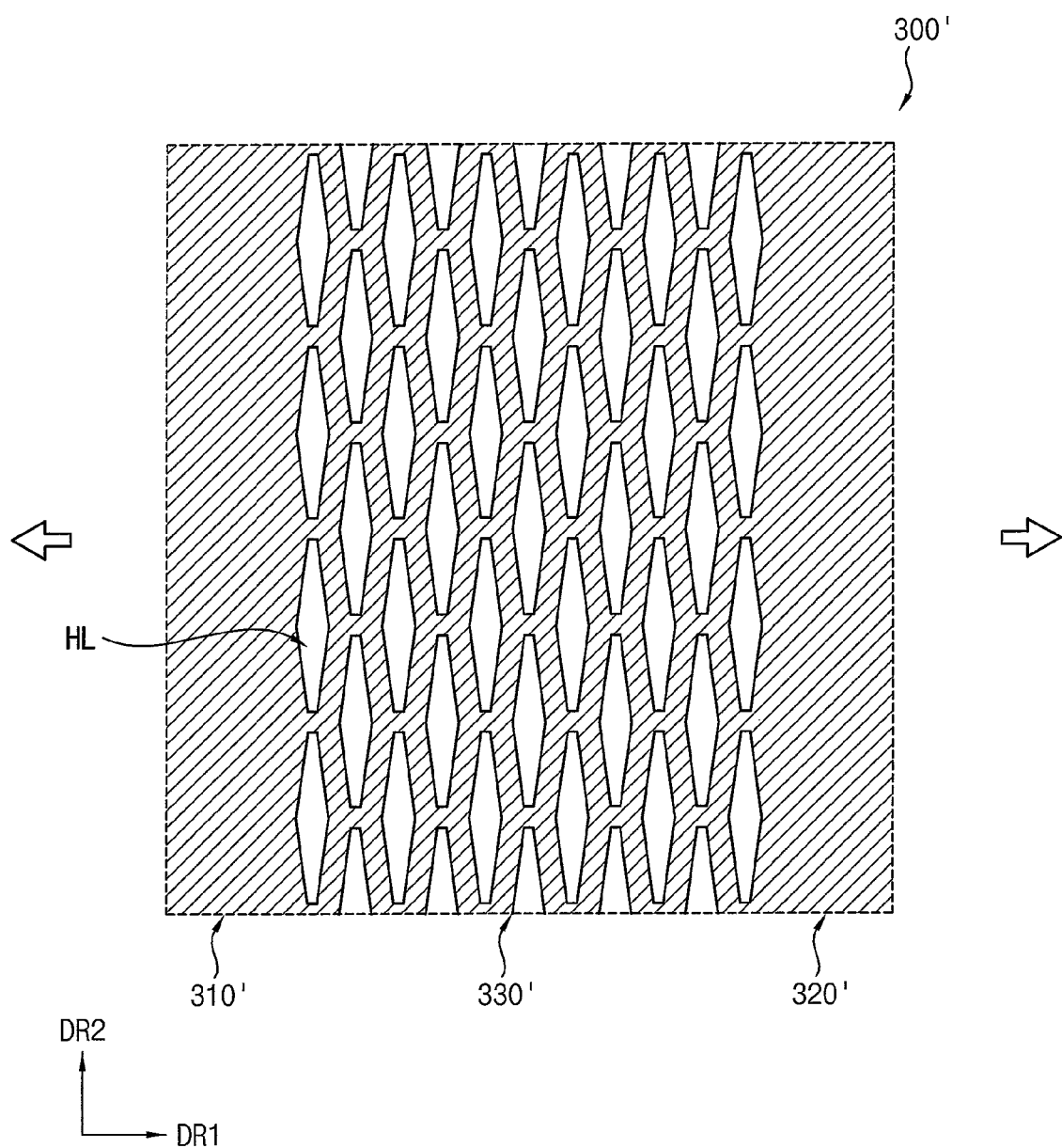
FIG. 8 is a plan view illustrating when a tensile stress is applied to the patterned portion of the support plate of FIG. 7.

FIG. 7 is a plan view illustrating an embodiment of a support plate according to a comparative example. FIG. 8 is a plan view illustrating when a tensile stress is applied to the patterned portion of the support plate of FIG. 7.

Referring to FIGS. 7 and 8, a patterned portion 330' of a support plate 300' according to a comparative example may include holes HL. Compared with the holes HL1, HL2, and HL3 of the patterned portion 330 of the support plate 300, the holes HL1, HL2, and HL3 according to the exemplary embodiments may have different shapes. However, the holes HL of the patterned portion 330' between first and second non-patterned portions 310' and 320' of the support plate 300' may have a rectangular shape substantially the same as each other. When tensile stress is applied to the patterned portion 330' according to the comparative example in the first direction DR1, the shape of the hole HL may be changed from the rectangular shape to a convex hexagonal shape, and the width in the second direction DR2 of the hole HL may decrease. Accordingly, the patterned portion 330' may be contracted in the second direction DR2 when the tensile stress is applied to the patterned portion 330'.

However, when the tensile stress is applied to the patterned portion 330 according to the exemplary embodiments in the first direction DR1, the shape of the first hole HL1 may be changed from the generally rectangular shape to the generally convex hexagonal shape so that the width in the second direction DR2 of the first hole HL1 may decrease, however, the shape of the second HL2 may be changed from the generally concave hexagonal shape to the generally rectangular shape so that the width in the second direction DR2 of the second hole HL2 may increase. Accordingly, the patterned portion 330 may not be contracted in the second direction DR2 when the tensile stress is applied to the patterned portion 330 in the first direction DR1.

Figure 9:
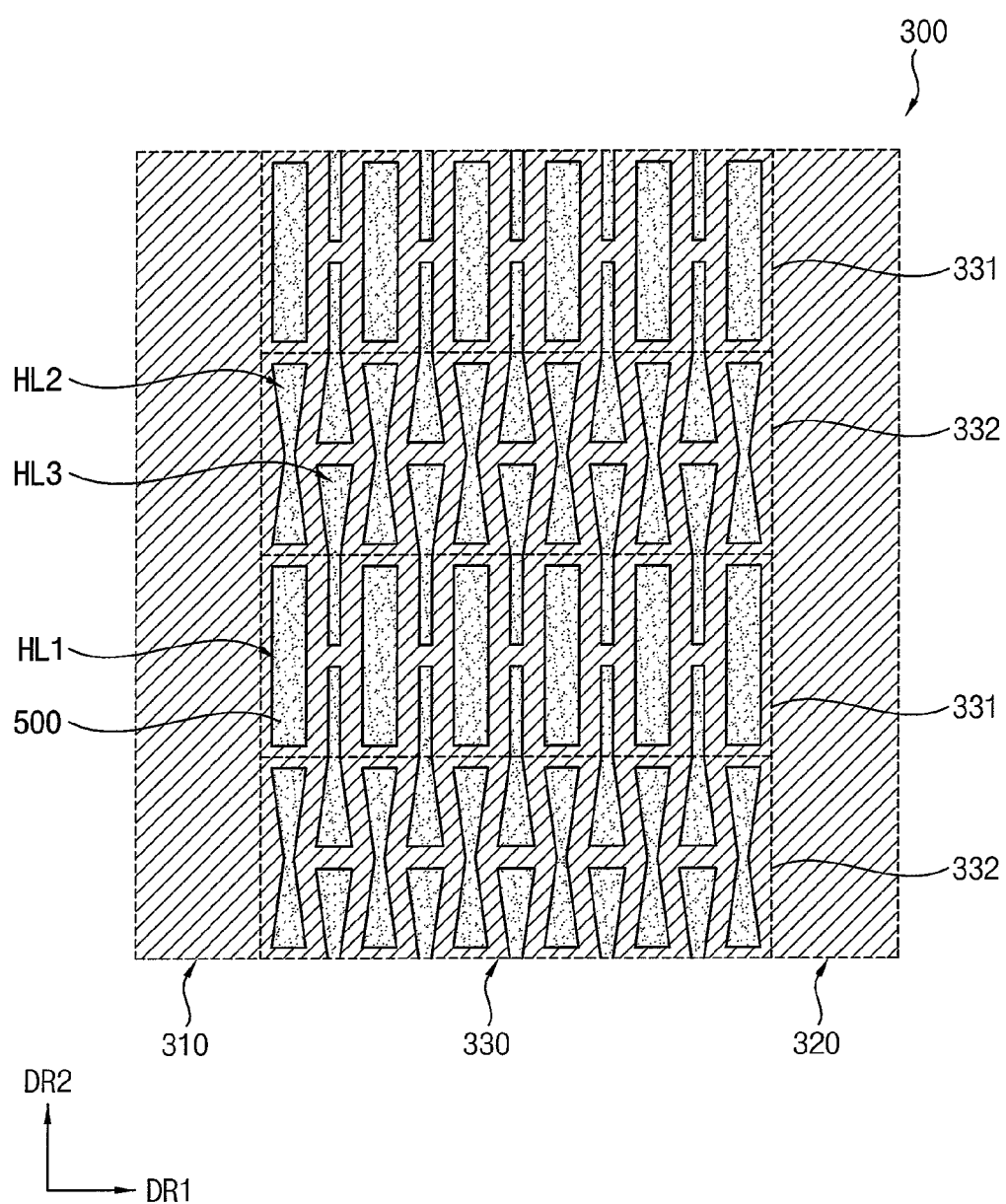
FIG. 9 is a plan view illustrating an exemplary embodiment of a support plate constructed according to principles of the invention.

FIG. 9 is a plan view illustrating an exemplary embodiment of a support plate constructed according to principles of the invention.

Referring to FIG. 9, in an exemplary embodiment, the foldable display device may include a material in the form of a filling member 500 disposed in the first hole HL1, the second hole HL2, and the third hole HL3 of the support plate 300.

The filling member 500 may include a high elastic material. In an exemplary embodiment, the filling member 500 may include a polymer resin such as a rubber, an elastomer, or the like.

In an exemplary embodiment, the elastic modulus of the filling member 500 may be greater than the elastic modulus of the support plate 300. Since the elastic modulus of the filling member 500 is greater than the elastic modulus of the support plate 300, the support plate 300 may not be contracted or expanded, and the shape of each of the holes HL1, HL2, and HL3 included in the support plate 300 may be changed, however, the filling member 500 may be contracted or expanded according to the change of the shape of each of the holes HL1, HL2, and HL3.

Figure 10:
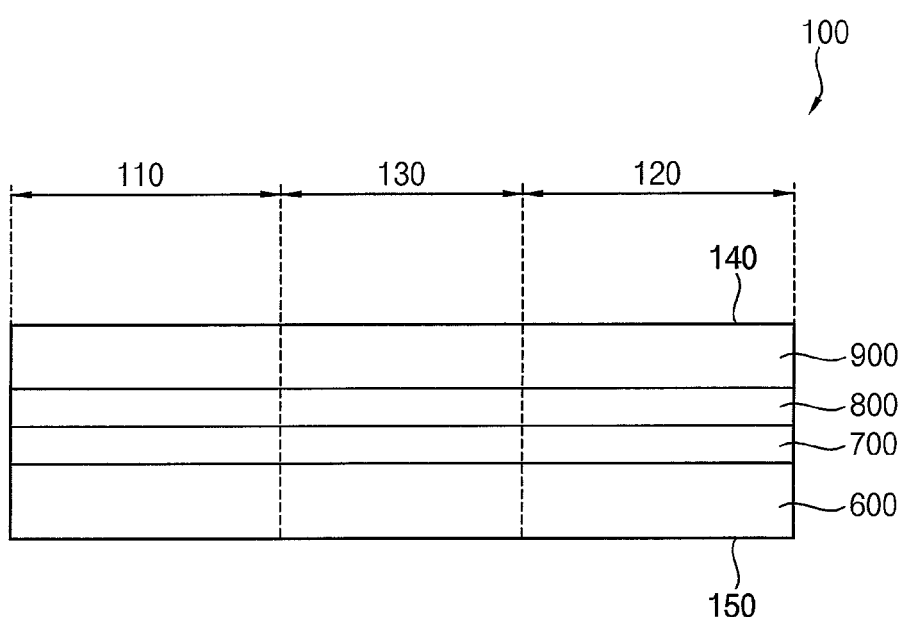
FIG. 10 is a cross-sectional view of an exemplary embodiment of the flexible display module of FIG. 3.

FIG. 10 is a cross-sectional view of an exemplary embodiment of the flexible display module of FIG. 3. Referring to FIGS. 3 and 10, the flexible display module 100 may include a display panel 600, a sensing layer 700, a polarization layer 800, and a window 900. As described above, since the flexible display module 100 may be folded or unfolded, each of the display panel 600, the sensing layer 700, the polarization layer 800, and the window 900 may have flexible characteristics.

The display panel 600 may include a plurality of pixels, and may generate an image formed by combining light beams emitted from the pixels. The display panel 600 may include a first surface and a second surface that are opposite to each other. The display panel 600 may display the image toward the first surface, and the second surface of the display panel 600 may correspond to the back surface 150 of the flexible display module 100.

The sensing layer 700 may be disposed on the display panel 600. The sensing layer 700 may sense an external input such as an external object that comes into contact with or approaches the foldable display device. For example, the sensing layer 700 may sense the external input by using a capacitive scheme.

The polarization layer 800 may be disposed on the sensing layer 700. The polarization layer 800 may reduce a reflection of external light of the foldable display device. For example, when the external light passes through the polarization layer 800, is reflected from a lower portion of the polarization layer 800 (for example, the display panel 600), and passes through the polarization layer 800 again, the external light passes through the polarization layer 800 twice, and thus a phase of the external light may be changed. Accordingly, the phase of the reflected light is different from the phase of the incident light entering the polarization layer 800, so that destructive interference may occur, and the reflection of the external light decreases, so that the visibility of the foldable display device may be improved.

The window 900 may be disposed on the polarization layer 800. The window 900 may protect the display panel 600, the sensing layer 700, and the polarization layer 800 from external shocks, and may provide the display surface 140 of the flexible display module 100. In an embodiment, the windows 900 may include a polymer resin such as a polycarbonate (PC), a polymethyl methacrylate (PMMA), a polyarylate (PAR), a polyethersulfone (PES), a polyethylene terephthalate (PET), or a polyethylene naphthalate (PEN), a glass and the like.

Figure 11:
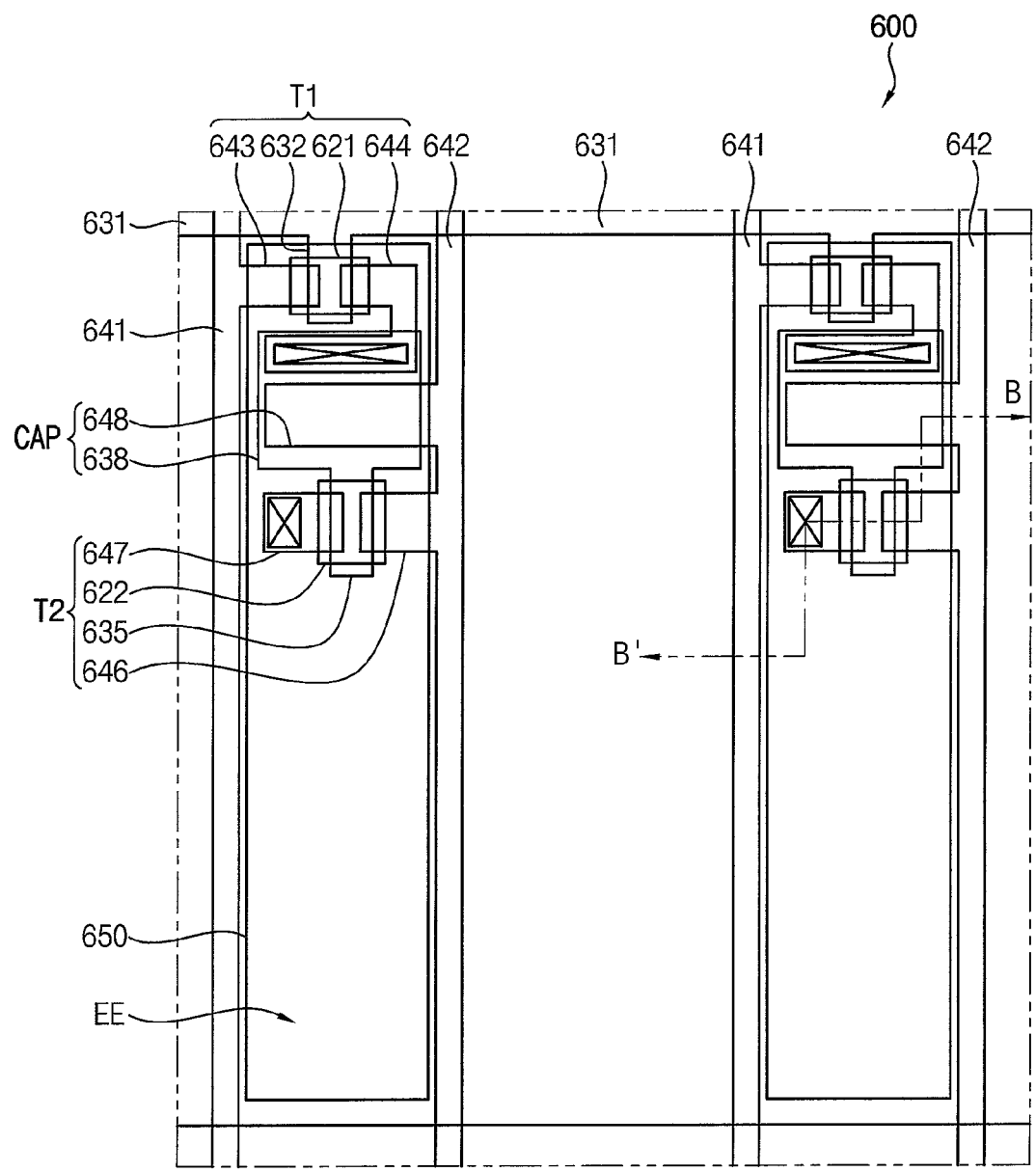
FIG. 11 is a plan view illustrating an exemplary embodiment of a display panel constructed according to principles of the invention.
Figure 12:
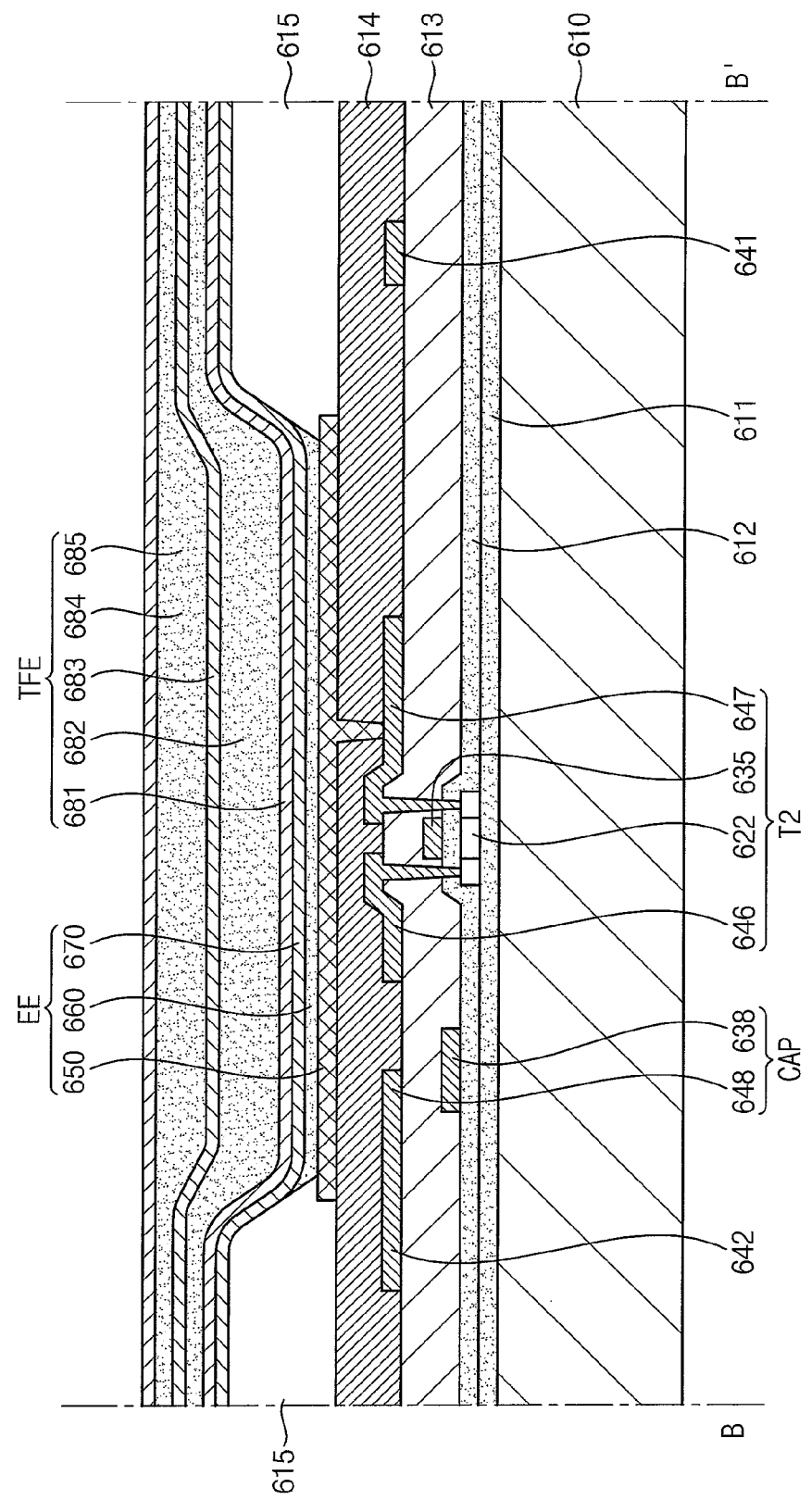
FIG. 12 is a cross-sectional view taken along line B-B' of FIG. 11.

FIG. 11 is a plan view illustrating an exemplary embodiment of a display panel constructed according to principles of the invention. FIG. 12 is a cross-sectional view taken along line B-B' of FIG. 11.

Referring to FIGS. 11 and 12, the display panel 600 may include a plurality of pixels in which each of the pixels includes a switching thin film transistor T1, a driving thin film transistor T2, a capacitor CAP, and a light emitting element EE. The pixel denotes the minimum unit for displaying an image, and the display panel 600 may display the image through the pixels.

Although FIGS. 11 and 12 illustrate that two thin film transistors and one capacitor are disposed in one pixel, the exemplary embodiments are not limited thereto, and one representative pixel may be provided with at least three thin film transistors and/or at least two capacitors.

The display panel 600 may include a substrate 610, a gate line 631 disposed on the substrate 610, a data line 641 insulated from and intersected with the gate line 631, and a common power line 642. In general, one pixel may be defined by the boundary between the gate line 631, the data line 641, and the common power line 642, but the pixel is not limited to the above-described definition. The pixel may be defined by a black matrix or a pixel defining layer.

The substrate 610 may include a flexible material such as a plastic. For example, the substrate 610 may be formed of a polyethersulfone (PES), a polycarbonate (PC), a polyimide (PI), a polyethylene terephthalate (PET), a polyethylene naphthalate (PEN), a polyacrylate (PAR), a fiber reinforced plastic (FRP), or the like.

The substrate 610 may have a thickness of about 5 μm to about 200 μm. When the substrate 610 has a thickness less than about 5 μm, it may be difficult for the substrate 610 to stably support the light emitting element EE. In addition, when the substrate 610 has a thickness greater than about 200 μm, the flexible characteristics of the substrate 610 may be deteriorated.

The buffer layer 611 may be disposed on the substrate 610. The buffer layer 611 may serve to prevent the penetration of impurities and planarize the surface. The buffer layer 611 may be formed of a silicon nitride, a silicon oxide, a silicon oxynitride, or the like. However, the buffer layer 611 is not necessarily required, and may be omitted according to a type of the substrate 610 and processing conditions.

A switching semiconductor layer 621 and a driving semiconductor layer 622 may be disposed on the buffer layer 611. The switching semiconductor layer 621 and the driving semiconductor layer 622 may be formed of one of a polycrystalline silicon, an amorphous silicon, and an oxide semiconductors such as an indium gallium zinc oxide (IGZO), an indium zinc tin oxide (IZTO) or the like. For example, when the driving semiconductor layer 622 is formed of a polycrystalline silicon, the driving semiconductor layer 622 may include a channel region that is not doped with impurities, and a source region and a drain region that are formed by doping impurities on opposite sides of the channel region. In this case, the doped impurities are P-type impurities such as boron (B), and $B_2H_6$ may be mainly used. The impurities may vary depending on the type of thin film transistor. Although the thin film transistor having a P-channel metal oxide semiconductor (PMOS) structure using the P-type impurities is used as the driving thin film transistor T2 in some exemplary embodiments, the driving thin film transistor T2 is not limited thereto, and a thin film transistor having an N-channel metal oxide semiconductor (NMOS) structure or a complementary metal oxide semiconductor (CMOS) structure may be used as the driving thin film transistor T2.

A gate insulating layer 612 may be disposed on the switching semiconductor layer 621 and the driving semiconductor layer 622. The gate insulating layer 612 may be formed of a tetraethoxysilane (TEOS), a silicon nitride, a silicon oxide, or the like. In an exemplary embodiment, the gate insulating layer 612 may have a double-layer structure in which a silicon nitride layer having a thickness of about 40 nm and a tetraethoxysilane layer having a thickness of about 80 nm are sequentially stacked.

A gate wiring including gate electrodes 632 and 635 may be disposed on the gate insulating layer 612. The gate wiring may further include a gate line 631, a first power storage plate 638, and the like. The gate electrodes 632 and 635 may be disposed to overlap at least a portion (e.g., the channel region) of the semiconductor layers 621 and 622. When the impurities are doped in the source region and the drain region of the semiconductor layers 621 and 622 in the process of forming the semiconductor layers 621 and 622, the gate electrodes 632 and 635 may serve to block the impurities from being doped in the channel region.

The gate electrodes 632 and 635 and the first power storage plate 638 may be disposed on the same layer, and may be formed of substantially the same metal. For example, the gate electrodes 632 and 635 and the first power storage plate 638 may be formed of molybdenum (Mo), chromium (Cr), tungsten (W), or the like.

An interlayer insulating layer 613 covering the gate electrodes 632 and 635 may be disposed on the gate insulating layer 612. Like the gate insulating layer 612, the interlayer insulating layer 613 may be formed of a tetraethoxysilane, a silicon nitride, a silicon oxide, or the like, but the material of the interlayer insulating layer 613 is not limited thereto.

Data wirings including source electrodes 643 and 646 and drain electrodes 644 and 647 may be disposed on the interlayer insulating layer 613. The data wiring may further include the data line 641, the common power line 642, a second power storage plate 648, and the like. The source electrodes 643 and 646 and the drain electrodes 644 and 647 may be connected to the source region and the drain region of the semiconductor layers 621 and 622 through contact holes formed in the gate insulating layer 612 and the interlayer insulating layer 613, respectively.

The switching thin film transistor T1 may include the switching semiconductor layer 621, a switching gate electrode 632, a switching source electrode 643, and a switching drain electrode 644, and the driving thin film transistor T2 may include the driving semiconductor layer 622, the driving gate electrode 635, the driving source electrode 646, and the driving drain electrode 647. In addition, the capacitor CAP may include the first power storage plate 638 and the second power storage plate 648 that are disposed with the interlayer insulating layer 613 therebetween.

The switching thin film transistor T1 may be used as a switching element for selecting a pixel configured to emit light. The switching gate electrode 632 may be connected to the gate line 631. The switching source electrode 643 may be connected to the data line 641. The switching drain electrode 644 may be spaced apart from the switching source electrode 643 and connected to the first power storage plate 638.

The driving thin film transistor T2 may apply a driving power, which allows the light emitting layer 660 of the light emitting element EE in the selected pixel, to the pixel electrode 650. The driving gate electrode 635 may be connected to the first power storage plate 638. The driving source electrode 646 and the second power storage plate 648 may be connected to the common power line 642. The driving drain electrode 647 may be connected to the pixel electrode 650 of the light emitting element EE through a contact hole.

According to the above structure, the switching thin film transistor T1 may be operated by a gate voltage applied to the gate line 631, thereby serving to transfer the data voltage applied to the data line 641 to the driving thin film transistor T2. A voltage corresponding to the difference between the common voltage applied from the common power line 642 to the driving thin film transistor T2 and the data voltage transferred from the switching thin film transistor T1 may be stored in the capacitor CAP, and a current corresponding to the voltage stored in the capacitor CAP flows into the light emitting element EE through the driving thin film transistor T2, so that the light emitting element EE may emit light.

A planarization layer 614 may be disposed on the interlayer insulating layer 613 to cover the data wirings patterned on the same layer as the data line 641, the common power line 642, the source electrodes 643 and 646, the drain electrodes 644 and 647, and the second power storage plate 648.

The planarization layer 614 may serve to remove and planarize steps to increase the luminance efficiency of the light emitting element EE formed thereon. The planarization layer 614 may be formed of an acrylic-based resin (polyacrylates resin), an epoxy resin, phenolic resins, a polyamide-based resin, a polyimide-based resin, an unsaturated polyester-based resin, a polyphenylene-based resin, a polyphenylene sulfide-based resin, a benzocyclobutene (BCB), or the like.

The pixel electrode 650 of the light emitting element EE may be disposed on the planarization layer 614. The pixel electrode 650 may be connected to the drain electrode 647 through a contact hole formed in the planarization layer 614.

A pixel defining layer 615 may be disposed on the planarization layer 614 to expose at least a portion of the pixel electrode 650 so as to define a pixel region. The pixel electrode 650 may be disposed to correspond to the pixel region of the pixel defining layer 615. The pixel defining layer 615 may be formed of a polyacrylate-based resin, a polyimide-based resin, or the like.

The light emitting layer 660 may be disposed on the pixel electrode 650 in the pixel region, and the common electrode 670 may be disposed on the pixel defining layer 615 and the light emitting layer 660. The light emitting layer 660 may be formed of a low molecular organic material or a high molecular organic material. At least one of a hole injection layer (HIL) and a hole transport layer (HTL) may be further disposed between the pixel electrode 650 and the light emitting layer 660, and at least one of an electron transport layer (ETL) and an electron injection layer (EIL) may be further disposed between the light emitting layer 660 and the common electrode 670.

Each of the pixel electrode 650 and the common electrode 670 may be formed as any one of a transmissive electrode, a transflective electrode, and a reflective electrode.

A transparent conductive oxide (TCO) may be used to form the transmissive electrode. The transparent conductive oxide (TCO) may include an indium tin oxide (ITO), an indium zinc oxide (IZO), a zinc oxide (ZnO), an indium oxide ($In_2O_3$), and the like.

In order to form the transflective electrode and the reflective electrode, metal such as magnesium (Mg), silver (Ag), gold (Au), calcium (Ca), lithium (Li), chromium (Cr), aluminum (Al), copper (Cu), or an alloy thereof may be used. The determination between the transflective electrode and the reflective electrode may depend on the thickness. In general, the transflective electrode may have a thickness of about 200 nm or less, and the reflective electrode may have a thickness of about 300 nm or more. The transflective electrode may have a higher light transmittance but have a higher resistance as the thickness decreases, and may have a lower light transmittance as the thickness increases. In addition, the transflective electrode and the reflective electrode may be formed in a multilayer structure including a metal layer formed of a metal or a metal alloy and a transparent conductive oxide layer stacked on the metal layer.

A thin film encapsulation layer TFE may be disposed on the common electrode 670. The thin film encapsulation layer TFE may include at least one inorganic layer 681, 683, and 685, and at least one organic layer 682 and 684. The thin film encapsulation layer TFE may have a structure in which the inorganic layers 681, 683 and 685 and the organic layers 682 and 684 are alternately stacked. In this case, the inorganic layer 681 may be disposed at the bottom. In other words, the inorganic layer 681 may be disposed most adjacent to the light emitting element EE. Although FIG. 12 illustrates that the thin film encapsulation layer TFE includes three inorganic layers 681, 683 and 685 and two organic layers 682 and 684, the exemplary embodiments are not limited thereto. The inorganic layers 681, 683 and 685 may be formed of at least one inorganic material of $Al_2O_3$, $TiO_2$, ZrO, $SiO_2$, AlON, AlN, SiON, $Si_3N_4$, ZnO, and $Ta_2Os$. The inorganic layers 681, 683 and 685 may be formed through chemical vapor deposition (CVD) or atomic layer deposition (ALD). The inorganic layers 681, 683 and 685 may mainly block the penetration of moisture or oxygen. The inorganic layers 681, 683 and 685 may block most of the moisture and oxygen from penetrating into the light emitting element EE.

The organic layers 682 and 684 may be formed of a polymer-based material. The polymer-based material may include an acrylate-based resin, an epoxy-based resin, a polyimide, a polyethylene, and the like. In addition, the organic layers 682 and 684 may be formed through a thermal deposition process. The thermal deposition process for forming the organic layers 682 and 684 may be performed within a temperature range that does not damage the light emitting element EE.

The thin film encapsulation layer TFE may have a thickness of about 10 μm or less. Accordingly, the overall thickness of the display panel 600 may be formed to be very thin. As such, the thin film encapsulation layer TFE may be disposed on the light emitting element EE, so that the flexible characteristics of the display panel 600 may be maximized.

The foldable display device according to the exemplary embodiments may be applied to a display device included in a computer, a notebook, a mobile phone, a smartphone, a smart pad, a PMP, a PDA, an MP3 player, or the like.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A foldable display device, comprising:
    a flexible display module including a first non-bendable portion, a second non-bendable portion spaced from the first non-bendable portion in a first direction, and a bendable portion disposed between the first non-bendable portion and the second non-bendable portion; and
    a support disposed on the flexible display module, the support including a patterned portion having a first pattern and a second pattern alternatively disposed along a second direction intersecting the first direction,
    wherein the first pattern includes a first discontinuity having a first shape, and the second pattern includes a second discontinuity having a second shape different from the first shape,
    wherein the second discontinuity comprises a hole having a generally ribbon-like shape.

2. The foldable display device of claim 1, wherein a dimension in the second direction of the first discontinuity decreases and a dimension in the second direction of the second discontinuity increases when a tensile stress is applied to the patterned portion in the first direction.

3. The foldable display device of claim 1, wherein the second discontinuity is spaced from the first discontinuity in the second direction.

4. The foldable display device of claim 1, wherein the patterned portion further includes a third discontinuity disposed between the first pattern and the second pattern.

5. The foldable display device of claim 4, wherein the third discontinuity comprises a third hole having a generally concave hexagonal shape when no tensile strength is applied to the patterned portion in the first direction, the third hole including a width in the second direction that is substantially constant when a tensile stress is applied to the patterned portion in the first direction.

6. The foldable display device of claim 4, wherein the third discontinuity comprises a third hole having a generally convex hexagonal shape when applying a tensile stress to the patterned portion in the first direction.

7. The foldable display device of claim 4, wherein the second discontinuity is spaced from the first discontinuity in the second direction, and the third discontinuity is spaced from the first discontinuity and the second discontinuity in the first direction.

8. The foldable display device of claim 4, wherein the third discontinuity comprises a third hole having a first portion overlapping the first pattern and a second portion overlapping the second pattern,
wherein the first portion has a generally rectangular shape, and the second portion has a generally trapezoidal shape.

9. The foldable display device of claim 8, wherein the first portion has a generally trapezoidal shape and the second portion has a generally rectangular shape when applying a tensile stress to the patterned portion in the first direction.

10. The foldable display device of claim 1, wherein the support comprises a support plate including at least one of stainless steel, copper (Cu), and graphite.

11. A foldable display device, comprising:
a flexible display module including a first non-bendable portion, a second non-bendable portion spaced from the first non-bendable portion in a first direction, and a bendable portion disposed between the first non-bendable portion and the second non-bendable portion; and
a support disposed on the flexible display module, the support including a patterned portion having a first pattern and a second pattern alternatively disposed along a second direction intersecting the first direction,
wherein the first pattern includes a first discontinuity having a first shape, and the second pattern includes a second discontinuity having a second shape different from the first shape,
wherein the first discontinuity comprises a first hole having a generally convex hexagonal shape and the second discontinuity comprises a second hole having a generally rectangular shape when a tensile stress is applied to the patterned portion in the first direction.

12. The foldable display device of claim 11, wherein the first hole has a generally honeycomb-like shape when applying the tensile stress to the patterned portion in the first direction.

13. A foldable display device, comprising:
a flexible display module including a first non-bendable portion, a second non-bendable portion spaced from the first non-bendable portion in a first direction, and a bendable portion disposed between the first non-bendable portion and the second non-bendable portion; and
a support disposed on the flexible display module, the support including a patterned portion having a first pattern and a second pattern alternatively disposed along a second direction intersecting the first direction,
wherein the first pattern includes a first discontinuity having a first shape, and the second pattern includes a second discontinuity having a second shape different from the first shape,
wherein a dimension of the second discontinuity in the second direction is substantially equal to a dimension of the first discontinuity in the second direction.

* * * * *